(12) United States Patent
Lin et al.

(10) Patent No.: US 12,532,419 B2
(45) Date of Patent: Jan. 20, 2026

(54) FLEXIBLE DISPLAY PANEL WITH BOTTOM SUPPORT LAYER AND FLEXIBLE DISPLAY DEVICE HAVING THE SAME

(71) Applicant: E Ink Holdings Inc., Hsinchu (TW)

(72) Inventors: Yi-Sheng Lin, Hsinchu (TW); Chia-Chun Yeh, Hsinchu (TW); Chen-Chu Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 167 days.

(21) Appl. No.: 18/531,718

(22) Filed: Dec. 7, 2023

(65) Prior Publication Data

US 2024/0298414 A1    Sep. 5, 2024

(30) Foreign Application Priority Data

Mar. 1, 2023    (TW) ................. 112107218

(51) Int. Cl.
*H05K 5/00*   (2025.01)
*B32B 7/12*   (2006.01)
*H05K 5/02*   (2006.01)

(52) U.S. Cl.
CPC ............. *H05K 5/02* (2013.01); *B32B 7/12* (2013.01); *B32B 2457/20* (2013.01)

(58) Field of Classification Search
CPC ........ H05K 5/02; B32B 7/12; B32B 2457/20; G06F 1/1652
See application file for complete search history.

(56) References Cited

U.S. PATENT DOCUMENTS

| | | | |
|---|---|---|---|
| 9,425,418 B2 * | 8/2016 | Kwon | H10K 59/8793 |
| 10,564,676 B2 | 2/2020 | Kwon et al. | |
| 10,971,696 B2 * | 4/2021 | Kim | B32B 27/38 |
| 11,083,094 B2 | 8/2021 | Zhou et al. | |
| 11,099,608 B2 * | 8/2021 | Kim | G06F 1/1652 |
| 11,398,611 B2 * | 7/2022 | Jeon | H10K 59/40 |
| 11,449,160 B2 * | 9/2022 | Nam | G06F 3/041 |
| 11,798,928 B2 * | 10/2023 | Shin | H10K 50/844 |
| 11,991,898 B2 * | 5/2024 | Song | B32B 27/306 |

(Continued)

FOREIGN PATENT DOCUMENTS

| | | |
|---|---|---|
| CN | 102610607 A | 7/2012 |
| TW | 202028818 A | 8/2020 |
| TW | 202111399 A | 3/2021 |

OTHER PUBLICATIONS

The office action of corresponding TW application No. 112107218 issued on Dec. 18, 2023.

*Primary Examiner* — Rockshana D Chowdhury
(74) *Attorney, Agent, or Firm* — CKC & Partners Co., LLC

(57) ABSTRACT

A flexible display panel includes a bottom support layer, a backside protective film layer, a display layer and a frontside protective film layer. The bottom support layer includes an adhesive area and a buffer area. The adhesive area is located at an end of the bottom support layer. The buffer area is adjacent to the side of the adhesive area. The backside protective film layer is located on the bottom support layer. The display layer is located on the backside protective film layer. An interface of the adhesive area and the buffer area and an edge of the display layer are misaligned in a vertical direction. The frontside protective film layer is located on the display layer. A portion of the frontside protective film layer adheres to the backside protective film layer.

16 Claims, 7 Drawing Sheets

(56) References Cited

U.S. PATENT DOCUMENTS

| | | | |
|---|---|---|---|
| 12,232,350 B2* | 2/2025 | Choi | G06F 1/1681 |
| 2015/0227171 A1* | 8/2015 | Choi | G06F 1/1652 |
| | | | 361/749 |
| 2016/0187929 A1 | 6/2016 | Kim et al. | |
| 2019/0059164 A1 | 2/2019 | Hassemer et al. | |
| 2019/0086760 A1* | 3/2019 | Wang | H10D 86/411 |
| 2020/0084890 A1 | 3/2020 | Jang et al. | |
| 2020/0134278 A1* | 4/2020 | Lee | H05K 9/0054 |
| 2020/0192431 A1* | 6/2020 | Shin | G06F 1/1626 |
| 2021/0004101 A1* | 1/2021 | Wei | G06F 1/1652 |
| 2021/0084778 A1 | 3/2021 | Zhou et al. | |
| 2021/0183275 A1 | 6/2021 | Han et al. | |
| 2021/0295749 A1 | 9/2021 | Hiroki et al. | |
| 2021/0329796 A1 | 10/2021 | Zhou et al. | |
| 2021/0405430 A1 | 12/2021 | Zhan et al. | |
| 2021/0408220 A1 | 12/2021 | Yueh et al. | |
| 2022/0141969 A1* | 5/2022 | Cho | B32B 7/12 |
| | | | 361/807 |
| 2022/0182477 A1* | 6/2022 | Kim | G06F 1/1652 |
| 2022/0192027 A1 | 6/2022 | Wang et al. | |
| 2022/0200132 A1 | 6/2022 | Oh et al. | |
| 2022/0209167 A1* | 6/2022 | Park | H10K 59/87 |
| 2022/0209180 A1* | 6/2022 | Song | B32B 27/36 |
| 2022/0236457 A1 | 7/2022 | Hwang et al. | |
| 2022/0238821 A1* | 7/2022 | Cho | H10K 59/87 |
| 2023/0045063 A1* | 2/2023 | Sunwoo | B32B 27/32 |
| 2023/0046408 A1* | 2/2023 | Wu | G06F 1/1624 |
| 2023/0063858 A1* | 3/2023 | Cavallaro | G06F 1/1656 |
| 2023/0154360 A1* | 5/2023 | Zhao | B32B 3/266 |
| 2023/0205274 A1* | 6/2023 | Lee | G06F 1/1656 |
| | | | 361/679.01 |
| 2023/0315154 A1* | 10/2023 | Manea | G06F 1/1641 |
| | | | 345/173 |
| 2024/0090149 A1* | 3/2024 | Min | G06F 1/1637 |
| 2024/0103202 A1* | 3/2024 | Kim | G06F 1/1652 |

* cited by examiner

FLEXIBLE DISPLAY PANEL WITH BOTTOM SUPPORT LAYER AND FLEXIBLE DISPLAY DEVICE HAVING THE SAME

RELATED APPLICATIONS

This application claims priority to Taiwan Application Serial Number 112107218, filed Mar. 1, 2023, which is herein incorporated by reference.

BACKGROUND

Field of Disclosure

The present disclosure relates to a flexible display panel and a flexible display device.

Description of Related Art

The flexible display panel is a display panel that is bendable, thin and highly flexible. Its applications spans from portable devices, display devices, electronic books to electronic papers, and it has a promising prospect due to its advantage of high flexibility. However, when storing a flexible display panel, one of the methods is to use a cylinder as a center to roll the flexible display panel, but a sharp edge may exist because the flexible display panel is made of multiple layers and the layers are aligned at the edge at the first circle, such that when the second circle is rolled up to the cylinder, the second circle touches the first circle, and a level difference caused by the sharp edge concentrates the stress into a point, which may results in a peeling of the layers. Moreover, the flat cables of a conventional rollable display device is disposed along the direction of the radius of the cylinder, which will cause a sharp angle difference between the display panel and the cylinder and increase the possibility of a rupture of the cables.

SUMMARY

One aspect of the present disclosure provides a flexible display panel.

According to one embodiment of the present disclosure, a flexible display panel includes a bottom support layer, a backside protective film layer, a display layer and a frontside protective film layer. The bottom support layer includes an adhesive area and a buffer area. The adhesive area is located at an end of the bottom support layer. The buffer area is adjacent to the side of the adhesive area. The backside protective film layer is located on the bottom support layer. The display layer is located on the backside protective film layer. An interface of the adhesive area and the buffer area and an edge of the display layer are misaligned in a vertical direction, and the display layer doesn't overlap with the adhesive area in the vertical direction. The frontside protective film layer is located on the display layer. A portion of the frontside protective film layer adheres to the backside protective film layer.

In some embodiments of the present disclosure, the flexible display panel further includes a function layer and a cover layer. The function layer is located on the frontside protective film layer. An edge of the function layer and an edge of the frontside protective film layer are misaligned in the vertical direction, and the edge of the function layer is recessed from the edge of the frontside protective film layer. The cover layer is located on the function layer.

In some embodiments of the present disclosure, an edge of the cover layer and the edge of the function layer are misaligned in the vertical direction, and the edge of the cover layer is recessed from the edge of the function layer.

In some embodiments of the present disclosure, the function layer doesn't overlap with the adhesive area of the bottom support layer in the vertical direction.

In some embodiments of the present disclosure, a portion of the function layer overlaps with the adhesive area of the bottom support layer in the vertical direction.

In some embodiments of the present disclosure, a portion of the cover layer overlaps with the adhesive area of the bottom support layer in the vertical direction.

In some embodiments of the present disclosure, another portion of the frontside protective film layer adheres to the adhesive area of the bottom support layer.

In some embodiments of the present disclosure, a portion of the cover layer adheres to the adhesive area of the bottom support layer and covers the frontside protective film layer, and the cover layer defines a falling wedge shape.

In some embodiments of the present disclosure, the flexible display panel further includes an edge sealant layer. The edge sealant layer is located between the frontside protective film layer and the backside protective film layer. An edge of the edge sealant layer is aligned to the edge of the frontside protective film layer.

One aspect of the present disclosure provides a flexible display device.

According to one embodiment of the present disclosure, a flexible display device includes a cylinder and a flexible display panel. The flexible display panel is configured to roll on the cylinder. The flexible display panel includes a bottom support layer, a backside protective film layer, a display layer and a frontside protective film layer. The bottom support layer includes an adhesive area and a buffer area. The adhesive area is located at an end of the bottom support layer closer to the cylinder. The adhesive area is fixed to the cylinder. The buffer area is adjacent to a side of the adhesive area. The backside protective film layer located on the bottom support layer. The backside protective film layer contacts the adhesive area and the buffer area. The display layer located on the backside protective film layer. An interface of the adhesive area and the buffer area and an edge of the display layer are misaligned in a vertical direction, and the display layer doesn't overlap with the adhesive area in the vertical direction. The frontside protective film layer is located on the display layer.

In some embodiments of the present disclosure, the frontside protective film layer has a first portion adhere to the backside protective film layer.

In some embodiments of the present disclosure, the frontside protective film layer has a second portion, and the second portion adheres to the adhesive area of the bottom support layer.

In some embodiments of the present disclosure, the flexible display device further includes a function layer and a cover layer. The function layer is located on the frontside protective film layer. An edge of the function layer and an edge of the frontside protective film layer are misaligned in the vertical direction, and the edge of the function layer is recessed from the edge of the frontside protective film layer. The cover layer is located on the function layer.

In some embodiments of the present disclosure, a portion of the backside protective film layer adheres to the frontside protective film layer.

In some embodiments of the present disclosure, a dummy area is located between the interface of the adhesive area and the buffer area and an edge of the frontside protective film layer, and a length of the dummy area is greater or equal to a circumference of the cylinder.

In some embodiments of the present disclosure, the flexible display panel further includes a chip. The chip is located between the backside protective film layer and the frontside protective film layer and electrically connects the display layer. The flexible display device further includes a circuit board and a flexible circuit board. The circuit board is located in the cylinder. The circuit board is parallel to a tangent direction of the cylinder. The flexible circuit board is located on the cylinder and the backside protective film layer and electrically connects the circuit board and the chip.

In some embodiments of the present disclosure, an included angle is between the flexible circuit board and the backside protective film layer, and the included angle is in a range from 90 degree to 180 degree.

In some embodiments of the present disclosure, the flexible circuit board is disposed along the tangent direction of the cylinder.

In the aforementioned embodiments of the present disclosure, since a misaligned design is used in the edges of the layers, a structure that is approximately an inclined plane is formed between the layers. Moreover, the flexible display panel has a buffer area of the bottom support layer to help absorb the stress. As a result, when rolling, the point where the second circle touches the first circle won't have a steep sharp edge or a sudden level difference, such that the level difference at the contact area is more moderate and continuous, and the stress can be dispersed. Also, since the interface of the buffer area and the adhesive area and the edge of the display layer are misaligned, a thinner buffer area can be used to absorb the stress when the second circle is rolled on to the first circle, which can effectively reduce the peeling of the layers. Moreover, since the flexible circuit board and the circuit board are disposed along the tangent direction of the cylinder, there won't be a steep included angle between the flexible circuit board and the backside protective film layer, which reduce the possibility of the rupture of the flexible circuit board caused by a change of angle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
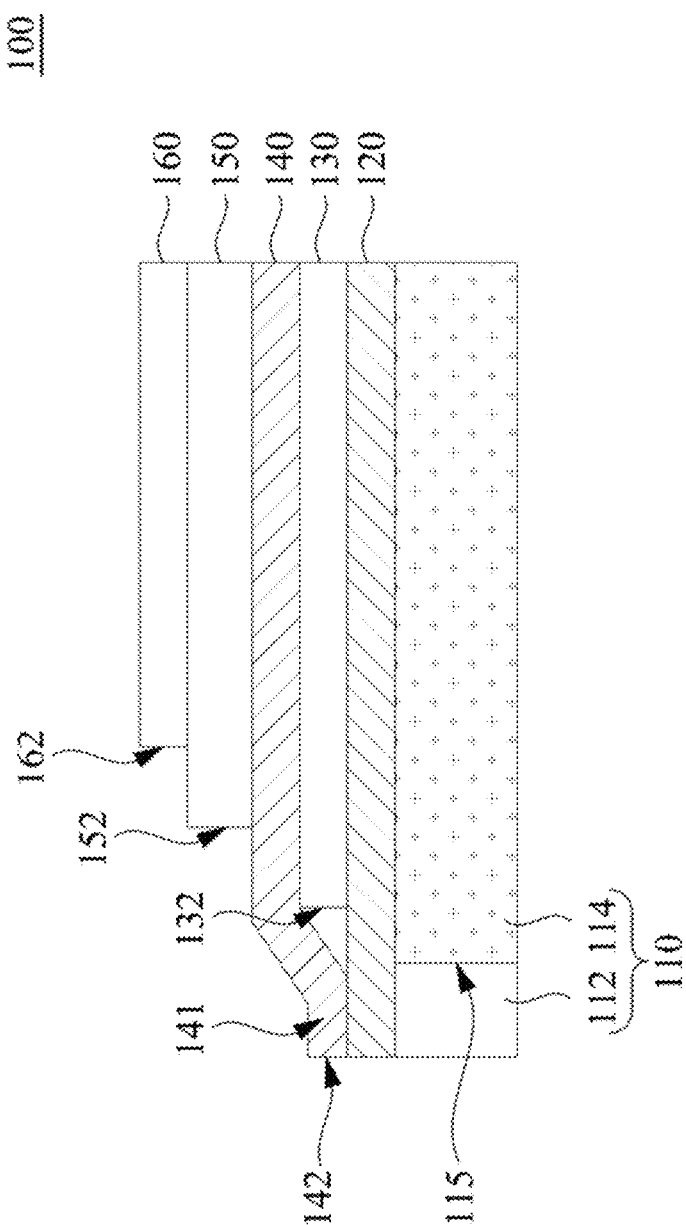
FIG. 1 is a cross-sectional view of a flexible display panel according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

FIG. 1 is a cross-sectional view of a flexible display panel 100 according to one embodiment of the present disclosure. Refer to FIG. 1, a flexible display panel 100 includes a bottom support layer 110, a backside protective film layer 120, a display layer 130 and a frontside protective film layer 140. The bottom support layer 110 includes an adhesive area 112 and a buffer area 114. The buffer area 114 can be, for example, sponge. The adhesive area 112 is located at an end of the bottom support layer 110. The buffer area 114 is adjacent to the side of the adhesive area 112. The backside protective film layer 120 is located on the bottom support layer 110. The display layer 130 is located on the backside protective film layer 120. The interface 115 of the adhesive area 112 and the buffer area 114 and the edge 132 of the display layer 130 are misaligned in a vertical direction, and the display layer 130 doesn't overlap with the adhesive area 112 in the vertical direction. The frontside protective film layer 140 is located on the display layer 130. A portion 141 of the frontside protective film layer 140 adheres to the backside protective film layer 120. In the present embodiment, the flexible display panel 100 further includes a function layer 150 and a cover layer 160. The function layer 150 is located on the frontside protective film layer 140. An edge 152 of the function layer 150 and an edge 142 of the frontside protective film layer 140 are misaligned in the vertical direction, and the edge 152 of the function layer 150 is recessed from the edge 142 of the frontside protective film layer 140. The cover layer 160 is located on the function layer 150. In the present embodiment, an edge 162 of the cover layer 160 and the edge 152 of the function layer 150 are misaligned in the vertical direction, and the edge 162 of the cover layer 160 is recessed from the edge 152 of the function layer 150. The function layer 150 doesn't overlap with the adhesive area 112 of the bottom support layer 110 in the vertical direction.

In the present embodiment, since the interface 115 of the adhesive area 112 and the buffer area 114, the edge 132 of the display layer 130, the edge 142 of the frontside protective film layer 140, the edge 152 of the function layer 150 and edge 162 of the cover layer 160 use a misaligned design (i.e. the recessed edges design from bottom to top), a structure that is approximately an inclined plane is formed between the layers. Moreover, the flexible display panel 100 can use the buffer area 114 of the bottom support layer 110 to absorb the stress. As a result, when rolling the flexible display panel 100 on a cylinder, the point where the second circle touches the first circle won't have a steep sharp edge or a sudden level difference, such that the level difference at the contact area is more moderate and continuous, and the stress can be dispersed. Also, since the interface 115 of the buffer area 114 and the adhesive area 112 and the edge 132 of the display layer 130 are misaligned, when rolling the flexible display panel 100 on a cylinder, since the interface 115 of the buffer area 114 and the adhesive area 112 and the edge 132 of the display layer 130 are misaligned, a thinner buffer area 114 can be used to absorb the stress without thickening the sponge of the buffer area 114 when the second circle is rolled on to the first circle, which can effectively reduce the peeling of the layers.

Figure 2:
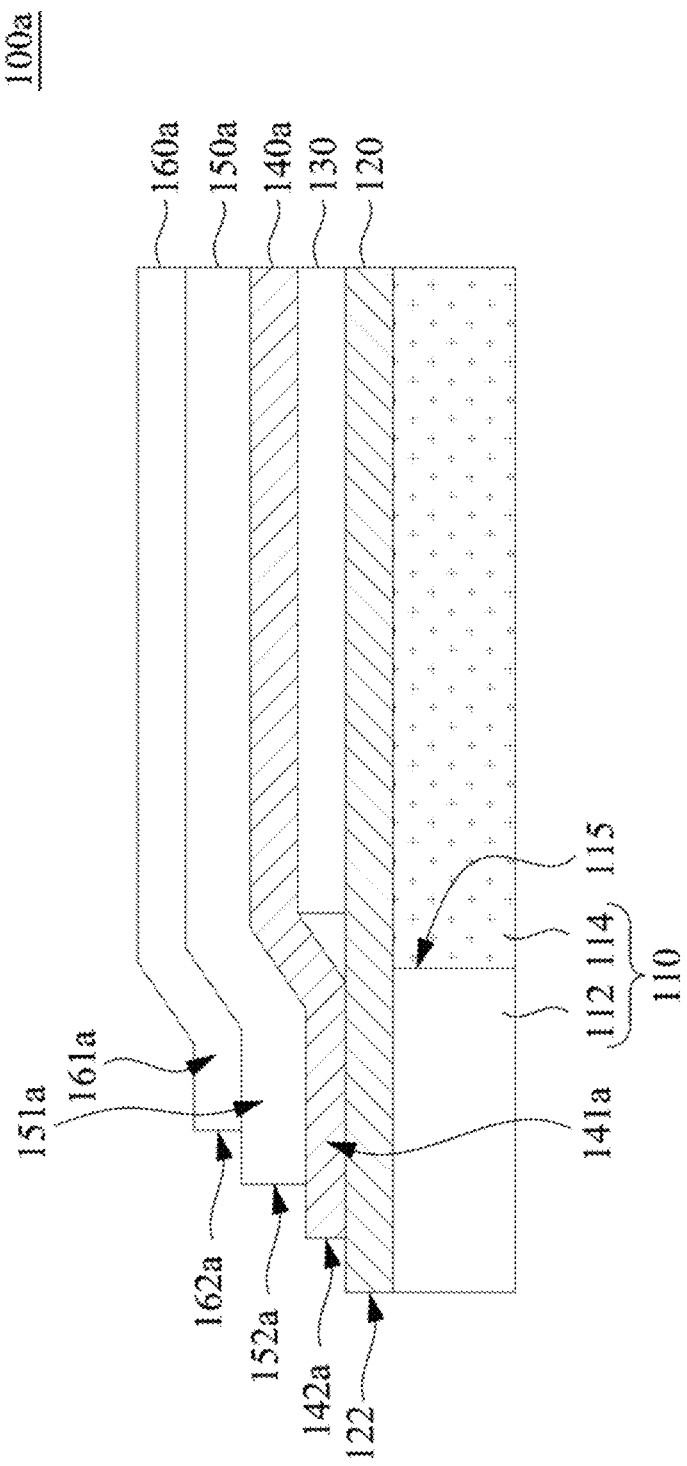
FIG. 2 is a cross-sectional view of a flexible display panel according to another embodiment of the present disclosure.

FIG. 2 is a cross-sectional view of a flexible display panel 100a according to another embodiment of the present disclosure. Refer to FIG. 2, the flexible display panel 100a includes a bottom support layer 110, a backside protective film layer 120, a display layer 130, a frontside protective film layer 140a, a function layer 150a and a cover layer 160a. The bottom support layer 110, the backside protective film layer 120 and the display layer 130 of FIG. 2 has a similar structure to the embodiment of FIG. 1, so it will not be repeated. The difference between the present embodiment and the embodiment of FIG. 1 is that a portion 141a of the frontside protective film layer 140a adheres to the backside protective film layer 120, and the edge 142a of the frontside protective film layer 140a and the edge 122 of the backside protective film layer 120 are misaligned in the vertical direction. The edge 142a of the frontside protective film layer 140a is recessed from the edge 122 of the backside protective film layer 120. In the present embodiment, the function layer 150a is disposed along the frontside protective film layer 140a, and a portion 151a of the function layer 150a overlaps with the adhesive area 112 of the bottom support layer 110 in the vertical direction. The cover layer 160a is disposed along the function layer 150a, and a portion 161a of the cover layer 160a overlaps with the adhesive area 112 of the bottom support layer 110 in the vertical direction. In the present embodiment, the edge 162a of the cover layer 160a, the edge 152a of the function layer 150a, the edge 142a of the frontside protective film layer 140a and the edge 122 of the backside protective film layer 120 form a stepped-shaped surface, and thus eliminate a sudden level difference, such that the present embodiment has the same effect of dispersing the stress as the former embodiment.

Figure 3:
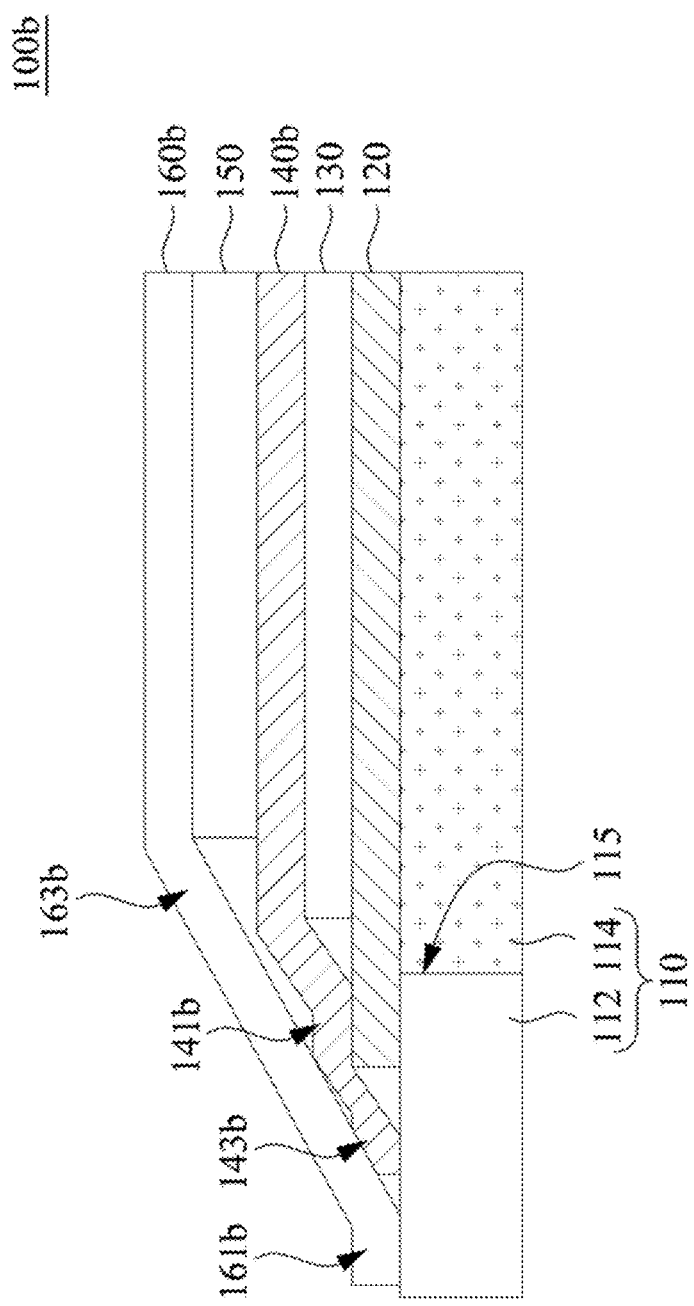
FIG. 3 is a cross-sectional view of a flexible display panel according to yet another embodiment of the present disclosure.

FIG. 3 is a cross-sectional view of a flexible display panel 100b according to yet another embodiment of the present disclosure. The difference between the embodiment of FIG. 3 and the embodiment of FIG. 2 is that a portion of the adhesive area 112 of the bottom support layer 110 is not covered by the backside protective film layer 120. The frontside protective film layer 140b has a first portion 141b adhere to the backside protective film layer 120. The frontside protective film layer 140b has a second portion 143b adheres to the adhesive area 112 of the bottom support layer 110 that is not covered by the backside protective film layer 120. In FIG. 3, the frontside protective film layer 140b is shown as a zig-zag shaped plane, but the frontside protective film layer 140b can be a continuous smooth plane in real applications. A portion 161b of the cover layer 160b adheres to the adhesive area 112 of the bottom support layer 110 and covers the frontside protective film layer 140b, and the cover layer 160b has a portion 163b that defines a falling-wedge-shaped platform, such that the cover layer 160b defines a falling-wedge-shaped structure. In the present embodiment, the portion 163b of the cover layer 160b can be used to eliminate the level difference, and thus achieve the effect of dispersing the stress.

Figure 4:
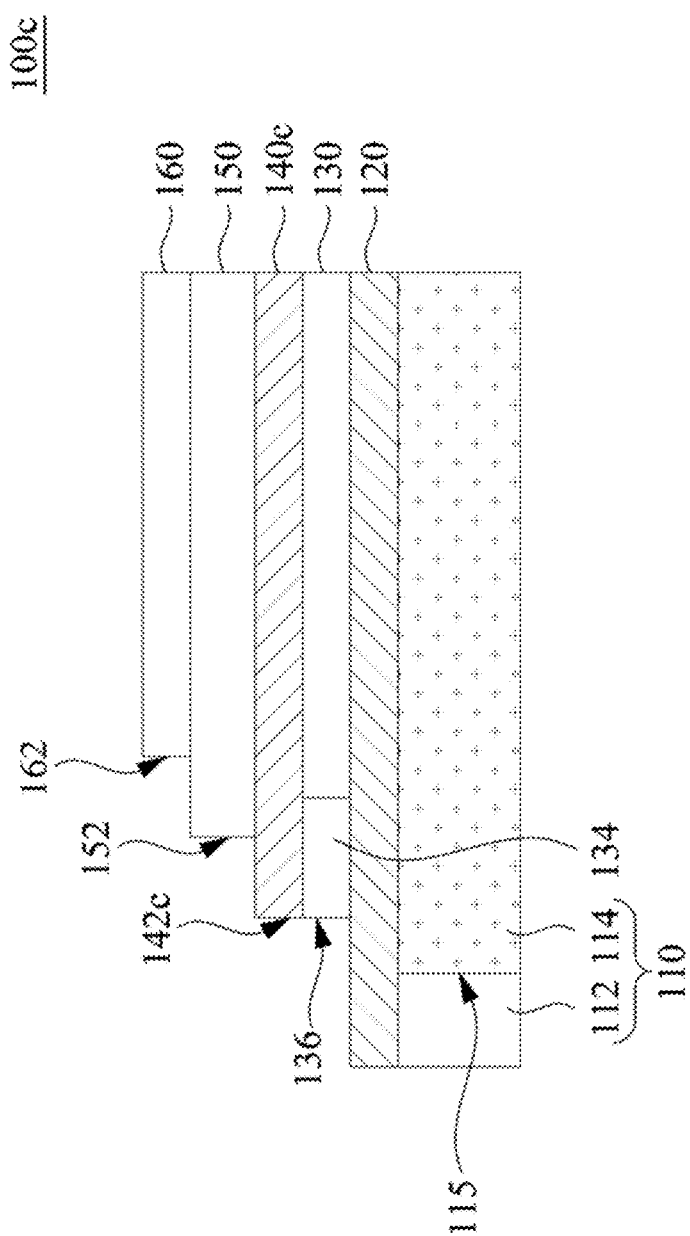
FIG. 4 is a cross-sectional view of a flexible display panel according to yet another embodiment of the present disclosure.

FIG. 4 is a cross-sectional view of a flexible display panel 100c according to yet another embodiment of the present disclosure. The difference between the embodiment of FIG. 4 and the embodiment of FIG. 1 is that the frontside protective film layer 140c doesn't directly adhere to the backside protective film layer 120, but adheres to the backside protective film layer 120 through an edge sealant layer 134. The edge sealant layer 134 is located between the frontside protective film layer 140c and the backside protective film layer 120. An edge 136 of the edge sealant layer 134 is aligned to the edge 142c of the frontside protective film layer 140c. In the present embodiment, since the edge 162 of the cover layer 160, the edge 152 of the function layer 150, the edge 142c of the frontside protective film layer 140c and the interface 115 of the buffer area 114 and the adhesive area 112 still use a misaligned design, and form a stepped structure, and thus achieve the effect of dispersing the stress.

Figure 5:
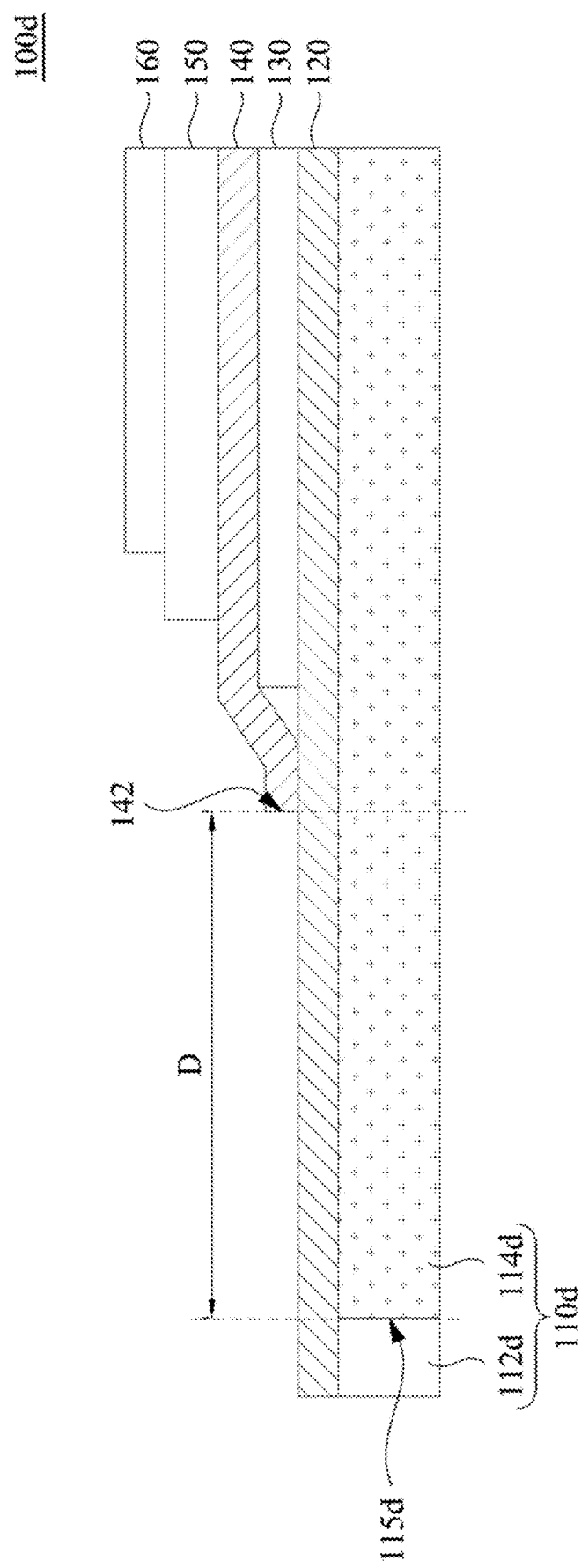
FIG. 5 is a cross-sectional view of a flexible display panel according to yet another embodiment of the present disclosure.

FIG. 5 is a cross-sectional view of a flexible display panel 100d according to yet another embodiment of the present disclosure. The difference between the embodiment of FIG. 5 and the embodiment of FIG. 1 is that a dummy area D is located between the interface 115d of the adhesive area 112d and the buffer area 114d and the edge 142 of the frontside protective film layer 140, and the length of the dummy area D is greater or equal to a circumference of the cylinder 170 (see FIG. 6) on which the flexible display panel 100d is rolled. Since the backside protective film layer 120, the display layer 130, the frontside protective film layer 140, the function layer 150 and the cover layer 160 of the flexible display panel 100d has a similar structure as the embodiment of FIG. 1, it will not be repeated. Since the flexible display panel 100d can be rolled and stored on a cylinder 170, and in terms of curvature, the curvature of the first circle and the second circle are the greatest, such that the effect of stress concentration will be the strongest. Thus, in terms of eliminating the level difference, eliminating the level differences of the first circle and the point where the second circle is rolled onto the first circle will be the priority to consider. In the present embodiment, the method to eliminate the level difference is to dispose a dummy area D, to roll the dummy area D to the cylinder 170 as the first circle and to use the misaligned design of the backside protective film layer 120, the display layer 130, the frontside protective film layer 140, the function layer 150 and the cover layer 160 after the dummy area D is rolled on the cylinder 170 to achieve an effect of dispersing the stress. In FIG. 5, although the backside protective film layer 120, the display layer 130, the frontside protective film layer 140, the function layer 150 and the cover layer 160 of the flexible display panel 100d has a similar structure as the embodiment of FIG. 1, they can also be replaced with the corresponding layers of the embodiments of FIG. 2, FIG. 3 or FIG. 4.

Figure 6:
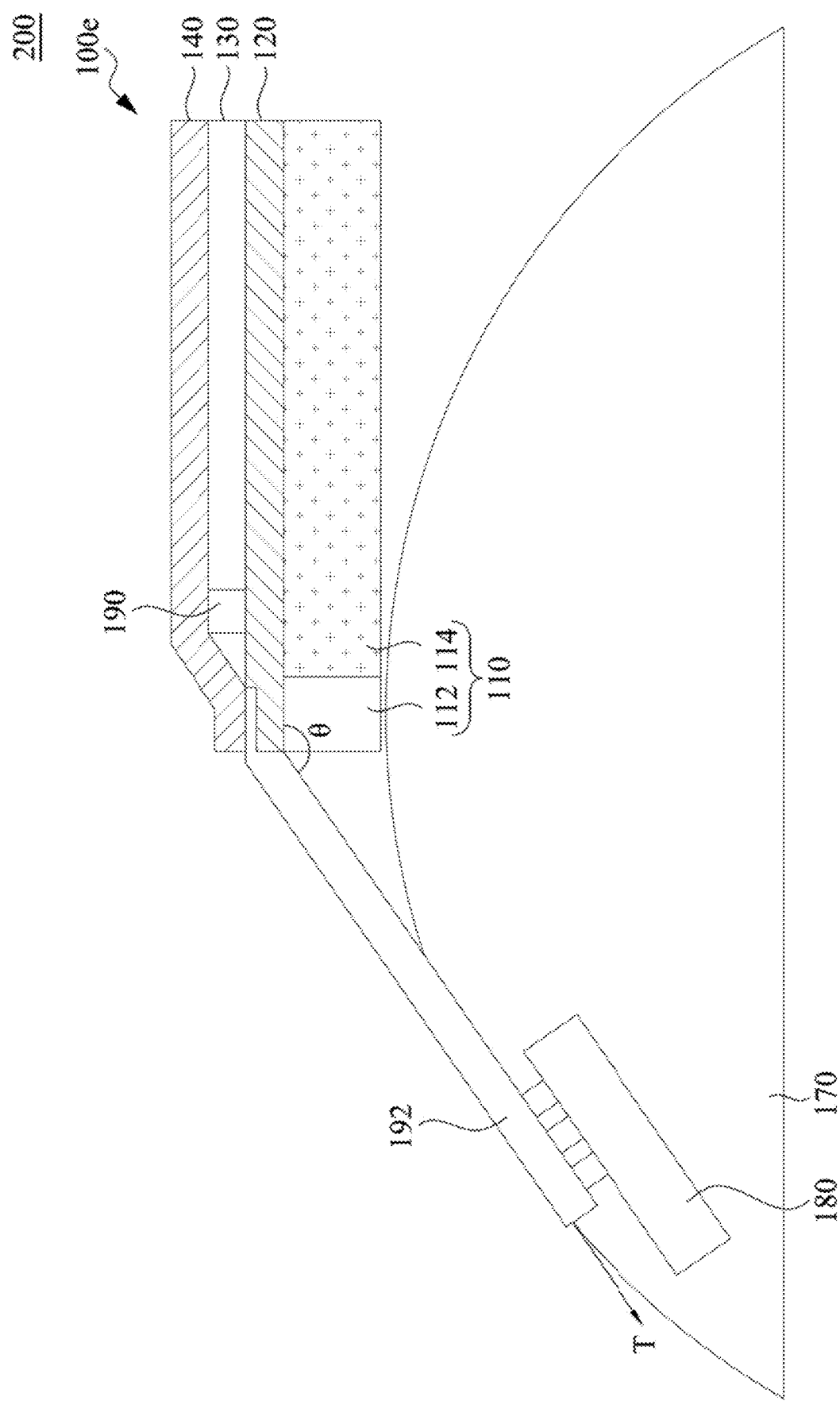
FIG. 6 is a cross-sectional view of a flexible display device according to one embodiment of the present disclosure.

FIG. 6 is a cross-sectional view of a flexible display device 200 according to one embodiment of the present disclosure. Refer to FIG. 6, a flexible display device 200 includes a cylinder 170 and a flexible display panel 100e. The flexible display panel 100e is configured to roll on the cylinder 170. The flexible display panel 100e can be optionally replaced with the flexible display panel 100, 100a, 100b, 100c or 100d of FIG. 1 to FIG. 5.

In the present embodiment, the flexible display panel 100e further includes a chip 190. The chip 190 is located between the backside protective film layer 120 and the frontside protective film layer 140 and electrically connects the display layer 130. The flexible display device 200 further includes a circuit board 180 and a flexible circuit board 192. The circuit board 180 is located in the cylinder 170. The circuit board 180 is parallel to a tangent direction T of the cylinder 170. The flexible circuit board 192 is located on the cylinder 170 and the backside protective film layer 120 and electrically connects the circuit board 180 and the chip 190. The flexible circuit board 192 is disposed along the tangent direction T of the cylinder 170. An included angle θ is between the flexible circuit board 192 and the backside protective film layer 120, and the included angle θ is in a range from 90 degree to 180 degree, which means that the included angle θ is an obtuse angle.

Since the flexible circuit board 192 is disposed along the tangent direction T of the cylinder 170 and an included angle θ in a range from 90 degree to 180 degree is between the flexible circuit board 192 and the backside protective film layer 120, there won't be a sharp included angle for the flexible circuit board 192, and thus prevents the risk of rupture owing to the stress when rolling and ensure the function of the flexible display device 200.

Figure 7:
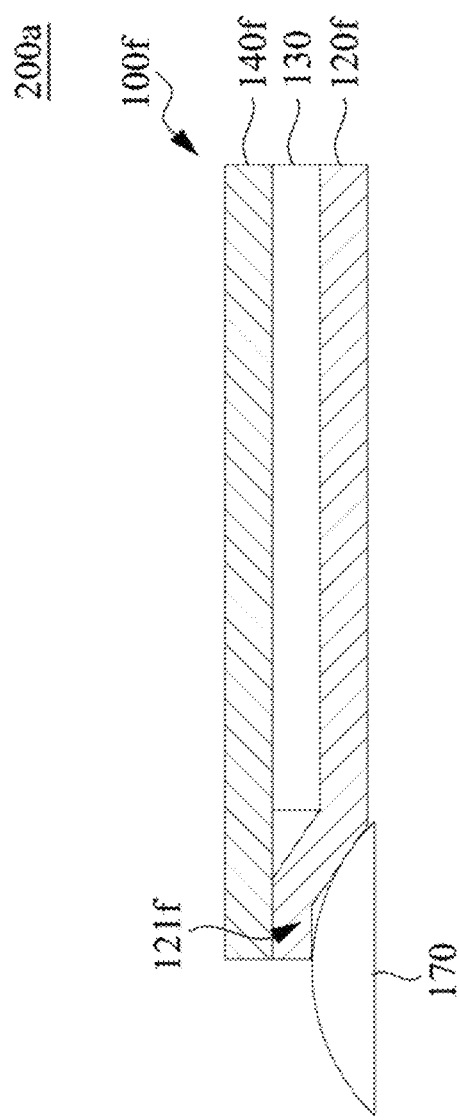
FIG. 7 is a cross-sectional view of a flexible display device according to another embodiment of the present disclosure.

FIG. 7 is a cross-sectional view of a flexible display device 200a according to another embodiment of the present disclosure. Refer to FIG. 7, a flexible display device 200a includes a cylinder 170 and a flexible display panel 100f. In the present embodiment, a portion 121f of the backside protective film layer 120f of the flexible display panel 100f adheres to the frontside protective film layer 140f, which is different from the embodiments (such as the flexible display panel 100 of FIG. 1) mentioned above that adhere a portion 141 of the frontside protective film layer 140 to the backside protective film layer 120. As a result of the design of the flexible display device 200a, the frontside protective film layer 140f at the outer circle can exert a downward force to the backside protective film layer 120f when rolling, such that the backside protective film layer 120f won't separate from the frontside protective film layer 140f, which result in a peeling effect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flexible display panel, comprising:
    a bottom support layer, comprising:
        an adhesive area located at an end of the bottom support layer; and
        a buffer area adjacent to a side of the adhesive area;
    a backside protective film layer located on the bottom support layer;
    a display layer located on the backside protective film layer, wherein an interface of the adhesive area and the buffer area and an edge of the display layer are misaligned in a vertical direction, and the display layer doesn't overlap with the adhesive area in the vertical direction;
    a frontside protective film layer located on the display layer, wherein a portion of the frontside protective film layer adheres to the backside protective film layer; and
    a function layer located on the frontside protective film layer, wherein an edge of the function layer and an edge of the frontside protective film layer are misaligned in the vertical direction, and the edge of the function layer is recessed from the edge of the frontside protective film layer; and
    a cover layer located on the function layer.

2. The flexible display panel of claim 1, wherein an edge of the cover layer and the edge of the function layer are misaligned in the vertical direction, and the edge of the cover layer is recessed from the edge of the function layer.

3. The flexible display panel of claim 2, wherein the function layer doesn't overlap with the adhesive area of the bottom support layer in the vertical direction.

4. The flexible display panel of claim 1, wherein a portion of the function layer overlaps with the adhesive area of the bottom support layer in the vertical direction.

5. The flexible display panel of claim 4, wherein a portion of the cover layer overlaps with the adhesive area of the bottom support layer in the vertical direction.

6. The flexible display panel of claim 1, wherein another portion of the frontside protective film layer adheres to the adhesive area of the bottom support layer.

7. The flexible display panel of claim 1, wherein a portion of the cover layer adheres to the adhesive area of the bottom support layer and covers the frontside protective film layer, and the cover layer defines a falling wedge shape.

8. The flexible display panel of claim 1, further comprising:
    an edge sealant layer located between the frontside protective film layer and the backside protective film layer, wherein an edge of the edge sealant layer is aligned to the edge of the frontside protective film layer.

9. A flexible display device, comprising:
    a cylinder; and
    a flexible display panel configured to roll on the cylinder, comprising:
        a bottom support layer located on the cylinder, comprising:
            an adhesive area located at an end of the bottom support layer closer to the cylinder, wherein the adhesive area is fixed to the cylinder; and
            a buffer area adjacent to a side of the adhesive area;
        a backside protective film layer located on the bottom support layer, wherein the backside protective film layer contacts the adhesive area and the buffer area;
        a display layer located on the backside protective film layer, wherein an interface of the adhesive area and the buffer area and an edge of the display layer are misaligned in a vertical direction, and the display layer doesn't overlap with the adhesive area in the vertical direction;
        a frontside protective film layer located on the display layer;
        a function layer located on the frontside protective film layer, wherein an edge of the function layer and an edge of the frontside protective film layer are misaligned in the vertical direction, and the edge of the function layer is recessed from the edge of the frontside protective film layer; and a cover layer located on the function layer.

10. The flexible display device of claim 9, wherein the frontside protective film layer has a first portion adhere to the backside protective film layer.

11. The flexible display device of claim 10, wherein the frontside protective film layer has a second portion, and the second portion adheres to the adhesive area of the bottom support layer.

12. The flexible display device of claim 9, wherein a portion of the backside protective film layer adheres to the frontside protective film layer.

13. The flexible display device of claim 9, wherein a dummy area is located between the interface of the adhesive area and the buffer area and an edge of the frontside protective film layer, and a length of the dummy area is greater or equal to a circumference of the cylinder.

14. The flexible display device of claim 9, wherein the flexible display panel further comprises a chip, the chip is located between the backside protective film layer and the frontside protective film layer and electrically connects the display layer, the flexible display device further comprises:
   a circuit board located in the cylinder, wherein the circuit board is parallel to a tangent direction of the cylinder; and
   a flexible circuit board located on the cylinder and the backside protective film layer and electrically connected to the circuit board and the chip.

15. The flexible display device of claim 14, wherein an included angle is between the flexible circuit board and the backside protective film layer, and the included angle is in a range from 90 degree to 180 degree.

16. The flexible display device of claim 14, wherein the flexible circuit board is disposed along the tangent direction of the cylinder.

\* \* \* \* \*